United States Patent
Tan et al.

(10) Patent No.: US 6,553,051 B1
(45) Date of Patent: Apr. 22, 2003

(54) SYSTEM FOR OPTICALLY PUMPING A LONG WAVELENGTH LASER USING A SHORT WAVELENGTH LASER

(75) Inventors: Michael R. T. Tan, Menlo Park, CA (US); Scott W. Corzine, Sunnyvale, CA (US); Dubravko I. Babic, Sunnyvale, CA (US); Albert T. Yuen, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 256 days.

(21) Appl. No.: 09/703,389

(22) Filed: Oct. 31, 2000

(51) Int. Cl.[7] .............................................. H01S 3/091
(52) U.S. Cl. ........................................ 372/70; 372/92
(58) Field of Search ............................ 372/69, 68, 70, 372/92

(56) References Cited

U.S. PATENT DOCUMENTS

| | | | |
|---|---|---|---|
| 4,462,103 A | 7/1984 | Salour et al. | 372/35 |
| 4,947,402 A | 8/1990 | Kane | 372/70 |
| 5,513,204 A | 4/1996 | Jayaraman | 372/96 |
| 5,754,578 A | 5/1998 | Jayaraman | 372/50 |
| 5,892,789 A * | 4/1999 | Yasui et al. | 372/69 |

* cited by examiner

Primary Examiner—Leon Scott, Jr.

(57) ABSTRACT

An optical assembly includes an optical subassembly containing a prefabricated long wavelength laser optically coupled to a prefabricated short wavelength laser located in a housing. The optical subassembly may be removably installed in the housing in which the short wavelength laser is contained. The short wavelength laser optically pumps the long wavelength laser resulting in a long wavelength laser output. The optical subassembly allows the independent fabrication, optimization and testing of the short wavelength laser and the long wavelength laser.

17 Claims, 3 Drawing Sheets

SYSTEM FOR OPTICALLY PUMPING A LONG WAVELENGTH LASER USING A SHORT WAVELENGTH LASER

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of contract No. MDA 972-97-3-0008 awarded by the Defense Advanced Research Projects Agency (DARPA) of the U.S.

TECHNICAL FIELD

The present invention relates generally to optoelectronic devices, and, more particularly, to an optical subassembly used to convert a short wavelength laser output into a long wavelength laser output.

BACKGROUND OF THE INVENTION

Light emitting diodes (LED's), lasers, vertical cavity surface emitting lasers (VCSELs), and the like (collectively known as light emitting devices) are widely used in many applications such as communications systems, medical systems, and display systems. These light emitting devices are commonly fabricated with epitaxial materials formed on a substrate, the epitaxial materials having a p-n junction, and an active or light generation region, formed therein and typically include at least one Bragg reflector. A Bragg reflector is a fundamental building block of many light emitting devices and is used to reflect and direct the light output of a semiconductor laser.

For lasers used in communication systems, and particularly for optical communications systems, it is desirable for the laser to emit a relatively long wavelength light on the order of approximately 1.3–1.55 micrometers ($\mu$m) and, in some applications, emit that light in a single spatial mode and in a single longitudinal mode. Laser emission at a single spatial mode and at a single longitudinal mode results in laser emission at single frequency. A long wavelength, single frequency output allows the laser emission to be focused into an optical fiber and to perform well in communications systems in which very high communication rates over long distances are required. Most optical fiber communication systems in use today operate either at the dispersion minimum of 1.3 $\mu$m or at the loss minimum of 1.55 $\mu$m.

In the past, largely because of the difficulty in obtaining low resistance, high reflectivity DBR mirrors having good long wavelength active regions in the semiconducting material system (such as indium phosphide (InP)), long wavelength VCSELs have been achieved by optically pumping a long wavelength VCSEL cavity with a short wavelength laser. The short wavelength laser was combined with the long wavelength laser using techniques such as wafer bonding, or using optical adhesive to join the two lasers. One problem with wafer bonding is that it is costly and adds at least one additional processing step. Also, there is always the possibility of damage when exposing the material to the high temperature and pressures associated with wafer bonding. Similarly, using an optical adhesive to join the two lasers increases cost and adds processing steps.

Another problem associated with joining a short wavelength laser with a long wavelength laser is that the output of the long wavelength laser also includes a short wavelength output component. That is, the prior art long wavelength laser devices emit both long wavelength light and short wavelength light. This is problematic in optical communications systems particularly over short distances because the short wavelength emission obscures the information contained in the long wavelength signal for distances which are not sufficient to filly attenuate the shorter wavelength signal.

Another problem is the thermal interaction between the wafers that have been bonded or joined by an adhesive. The heat generated during the absorption process needs to be removed as it may limit the performance of the long wavelength output. Also, the heat generated by the short wavelength laser will dramatically affect the performance of the long wavelength output.

Therefore, an unaddressed need exists in the industry for a long wavelength laser that avoids the use of wafer bonding or using optical adhesive to join two laser devices.

SUMMARY OF THE INVENTION

The invention is an optical assembly that includes an optimized electrically pumped short wavelength VCSEL and an optimized optically pumped long wavelength VCSEL. The two independently optimized VCSELs are integrated at the packaging step to form a device having a long wavelength output.

In architecture, the present invention may be conceptualized as an optical assembly, comprising a housing, a prefabricated short wavelength laser located in the housing and optimized for a short wavelength laser output, a prefabricated long wavelength laser optimized for a long wavelength laser output, and an optical subassembly structured to accommodate the prefabricated long wavelength laser and located within the housing in a position at which the output of the short wavelength laser is applied to the long wavelength laser. This arrangement provides a selectable long wavelength (1.3–1.55 $\mu$m) laser output from a short wavelength input pump.

The present invention may also be conceptualized as a method for forming an optical assembly, comprising the steps of locating a prefabricated short wavelength laser in a housing, locating a long wavelength laser in an optical subassembly, and placing the optical subassembly containing the long wavelength laser in the housing in a light output path of the short wavelength laser, such that an output of the short wavelength laser is directed into the optical subassembly and optically pumps the long wavelength laser resulting in a long wavelength laser output.

The invention has numerous advantages, a few of which are delineated, hereafter, as merely examples.

An advantage of the invention is that the separation of the design, fabrication and testing of a short wavelength laser from a long wavelength laser allows each laser to be independently optimized.

Another advantage of the invention is that it simplifies the fabrication of an optical assembly and is capable of emitting a long wavelength laser output.

Another advantage of the invention is that it eliminates the need to wafer bond two laser devices.

Another advantage is that the thermal interaction between the devices has been effectively eliminated, thereby reducing the wavelength variation of the long-wavelength output with respect to the short-wavelength laser bias and temperature. The long wavelength laser cavity extracts the heat rise associated with the absorption of the energy from the short wavelength laser.

Another advantage of the invention is that it allows a long wavelength laser to be modularly packaged with a short wavelength laser.

Another advantage of the invention is that it allows the ability to use the same short wavelength product assembly, and near to end of the packaging step, determine whether the final product is to be a short wavelength laser or a long wavelength laser. The optical subassembly for long wavelength conversion may be inserted at the end of the packaging process.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

While the invention can be implemented using a variety of laser devices, the optical subassembly for wavelength conversion is particularly useful for converting the output of a short-wavelength vertical-cavity surface-emitting laser (VCSEL) into a long wavelength laser output. Furthermore, the present invention is applicable to both single spatial mode laser output and to multi-mode laser output.

Figure 1:
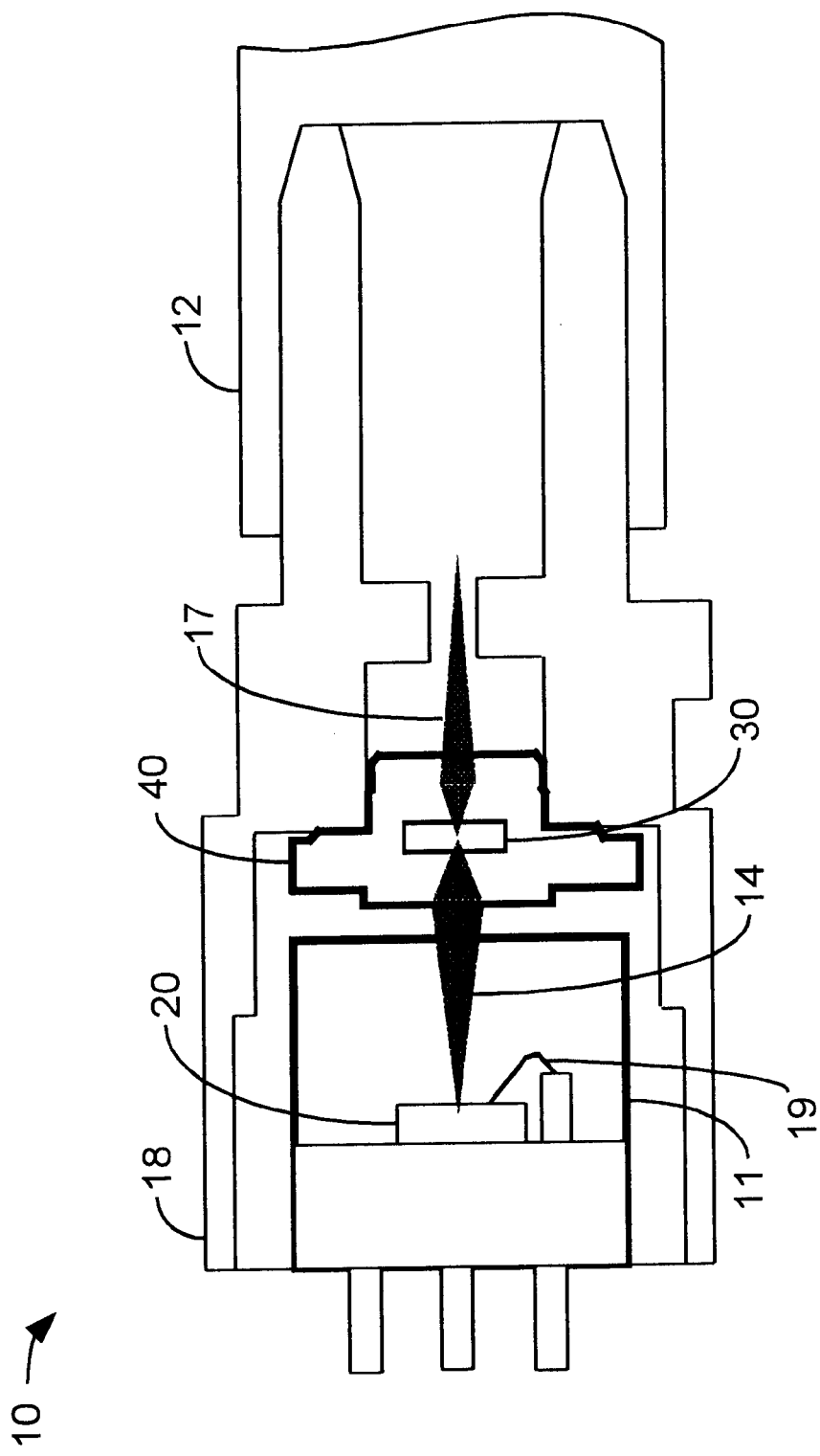
FIG. 1 is a cross-sectional schematic view illustrating an optical assembly constructed in accordance with the present invention.

Turning now to the drawings, FIG. 1 is a cross sectional schematic view illustrating an optical assembly 10 constructed in accordance with an aspect of the invention. Optical assembly 10 includes optical assembly housing 18 in which TO package 11 and optical subassembly 40 reside. Optical assembly housing 18 may be, for example, an optical component that may be soldered, or otherwise assembled to a circuit board, or may be an optical connector to which may be attached a fiber optic connector 12, which connects a fiber optic cable to the optical assembly 10.

TO package 11 may be a typical TO-46 header package as known in the art. Alternatively, TO package 11 may be any standard package containing short wavelength laser 20. Alternatively, short-wavelength laser 20 may not necessarily be packaged in a TO package and may be mounted directly into the optical assembly 10. In accordance with a preferred embodiment of the invention, short wavelength laser 20 is preferably a VCSEL. Short wavelength laser 20 may be independently optimized, assembled, tested and packaged into TO package 11. The optimization of the short-wavelength laser includes maximizing the wallplug efficiency and adjusting the beam divergence to optimize coupling to the long-wavelength laser. The wallplug efficiency is defined as the ratio of optical output power to electrical input power to the device. As illustrated by electrical connection 19 short-wavelength laser 20 is electrically pumped, or driven by an appropriate laser driver.

Optical assembly housing 18 also includes optical subassembly 40. Optical subassembly 40 includes long-wavelength laser 30, which may be a vertical-cavity surface-emitting laser. Short-wavelength laser 20 preferably emits light at a wavelength of approxi-mately 850 to 1200 nm, while long-wavelength laser 30 preferably emits light at a wavelength of approximately 1300 nm to 1550 nm. The conversion efficiency between the short wavelength laser 20 and the long wavelength laser 40 can be improved if the short wavelength laser 20 can be located as close to the long wavelength laser 40 as possible without interfering with the optimization of the long wavelength laser 40. Locating the short wavelength laser 20 close to the long wavelength laser 40 improves the transfer of photon energy between the two lasers. In similar fashion to that of short-wavelength laser 20, the long-wavelength laser 30 may be independently optimized, assembled, tested and installed within optical subassembly 40. The long-wavelength laser optimization may include maximizing the absorption of the short wavelength light originating from the short-wavelength laser, minimizing the threshold power, maximizing the output efficiency, and adjusting the cavity for either single or multiple transverse mode operation.

Optical subassembly 40 is modular in that it may be inserted into optical assembly housing 18 and easily removed. For example, optical subassembly 40 may be snapped into place. Alternatively, optical subassembly may be permanently affixed within optical assembly housing 18.

Long wavelength laser 30 is electrically passive, meaning that no electrical pumping is necessary. Short wavelength laser 20 optically pumps long wavelength laser 30. Consequently, long wavelength laser 30 requires no electrical connections.

Once short wavelength laser 20 is installed in TO package 11, TO package 11 can be installed within optical housing 18. In accordance with an aspect of the invention, long wavelength laser 30 can be independently optimized and installed in optical subassembly 40. Optical subassembly 40 may be installed within optical assembly housing 18 thus completing optical assembly 10.

As shown, short wavelength laser 20 emits short wavelength laser output 14, which is directed toward optical subassembly 40. Optical subassembly 40 may optionally include one or more optical elements, to be described in detail with reference to FIG. 4. Furthermore, an optical element may be included that focuses the short wavelength light output 14 and another optical element may be included that focuses the long wavelength light output 17. If included, at least one of the optional optical elements focuses the short wavelength laser output 14 onto long wavelength laser 30. Another optical element focuses the long wavelength output 17 of long wavelength laser 30 into fiber optic connector 12.

When installed within optical assembly housing 18, optical subassembly 40 should be aligned with TO package 11 such that the short wavelength laser output 14 is optimally focused onto optical subassembly 40, and thus long wavelength laser 30, such that the spot size of short wavelength laser output 14 produces maximum efficiency in the long-wavelength output. For single mode applications, the short wavelength laser spot size is optimally chosen to yield a single mode output for the long wavelength laser.

The alignment and focus between the short wavelength laser 20 and the long wavelength laser 30 can be realized by specially designed mechanical guides or any manner in which the optical subassembly 40 can be precisely located within the optical assembly housing 18 and with respect to the short wavelength laser 20. The optical subassembly 40 is located in the optical assembly housing 18 such that the long wavelength laser 30 receives the light output of short wavelength laser 20. Optional optics (to be described below with reference to FIG. 4) can focus the short wavelength output 14 onto the optical subassembly 40, which contains the long wavelength laser 30. The optical subassembly 40 is mounted such that the short wavelength laser output 14 is focused to a desired spot size on the long wavelength laser 30. The optical subassembly 40 can be glued, soldered or otherwise mechanically held in place in the optical assembly housing 18. Alternatively, the optical subassembly 40 can be removably mounted within the optical assembly housing 18 using, for example, a retainer ring.

The short wavelength laser output 14 is absorbed by the long wavelength laser 30, which causes the long wavelength laser to generate electron-hole pairs in the absorbing layers in the long wavelength laser 30. The electron-hole pairs are funnelled into the active region of the long wavelength laser 30 where these electron-hole pairs recombine emitting light at the longer wavelength as long wavelength laser output 17. Long wavelength laser output 17 is preferably of a single longitudinal mode and a single spatial mode for optical communications, resulting in a single frequency output that may be efficiently focused into an optical fiber. Alternatively, the long wavelength laser output may be multi-mode for other applications.

Figure 2:
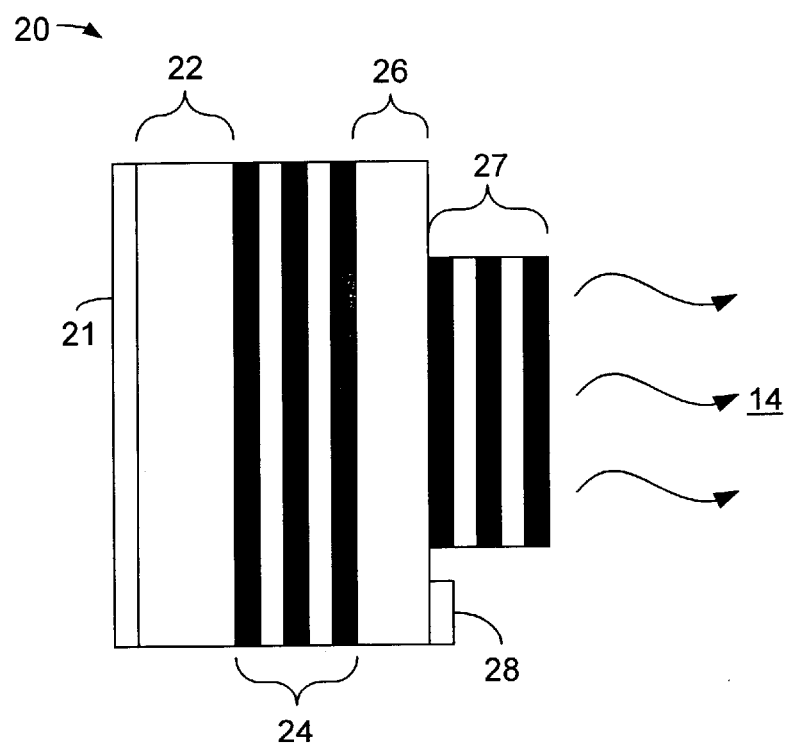
FIG. 2 is a simplified cross-sectional view illustrating the short wavelength laser of FIG. 1.

Referring now to FIG. 2, shown is a simplified cross-sectional schematic view illustrating the short wavelength laser 20 of FIG. 1. Short wavelength laser 20 generally includes a first mirror 24 located upon a substrate 22, an active layer 26, a second mirror 27, and electrical contacts 21 and 28. The two mirrors 24 and 27, as known in the art, may be comprised of multiple layers of aluminum-gallium arsenide (AlGaAs) alloy with alternating composition values in order to produce a structure with layers of alternating values of the refractive index. The composition of the alloy varies from layer to layer in such a way that the refractive index of the layers varies from high to low, and vice versa. Such layered mirrors 24 and 27 are sometimes referred to as Bragg mirrors, or distributed Brag reflectors (DBRs). The ratio between the refractive indexes of the high-index and the low index-layer together with the number of layers determines the reflectivity of the mirror. The thickness of each low-index and high-index layer in such a mirror is $\lambda/4n$ (or odd multiples thereof), where $\lambda$ is the in-vacuum wavelength of light that the laser is designed to emit, and n is the refractive index of the material. Note that any odd integer multiple of $\lambda/4n$ may be used. For example, material thickness of $3\lambda/4n$ or $5\lambda/4n$ may also be used. Typical material choice for the short wavelength VCSEL 20 shown in FIG. 2 is aluminum-gallium arsenide with two different compositions because the refractive index varies with the aluminum composition. In a preferred embodiment, DBR 24 has maximum high reflectivity (approaching 99.9%) because light will be emitted opposite from the substrate 22.

Active layer 26 is grown over the DBR 24. Active layer 26 comprises alternating layers of gallium arsenide (GaAs), aluminum-gallium arsenide (AlGaAs), indium-gallium arsenide (InGaAs) or aluminum-indium-gallium arsenide (AlInGaAs), for example, forming multiple quantum wells.

The output DBR 27 is grown over the active layer 26. While also comprising multiple layers of aluminum-gallium arsenide, DBR 27 has a smaller number of layers to provide a typically lower reflectivity required of the output mirror. The reflectivity of DBR 27 is optimized for maximum laser speed and efficiency. Light output 14 indicates the light output of short wavelength laser 20. DBR 27 is more transmissive than DBR 24 for the reason that light will be emitted through DBR 27 in the direction indicated by light output 14. DBR 24 and DBR 27 are designed and doped accordingly to present a low resistance, thus enabling current to flow to the active region 26 as known to those having ordinary skill in the art.

Electrode 21 is applied to substrate 22 and electrode 28 is applied to active region 26. Current flowing between electrode 21 and electrode 28 electrically pumps active region 26 resulting in the desired short wavelength output 14. It should be noted that only the major portions of short wavelength laser 20 have been described and that the description above is merely one technique for developing a short wavelength laser. Many other techniques may be employed, which remain within the scope of the invention.

Figure 3:
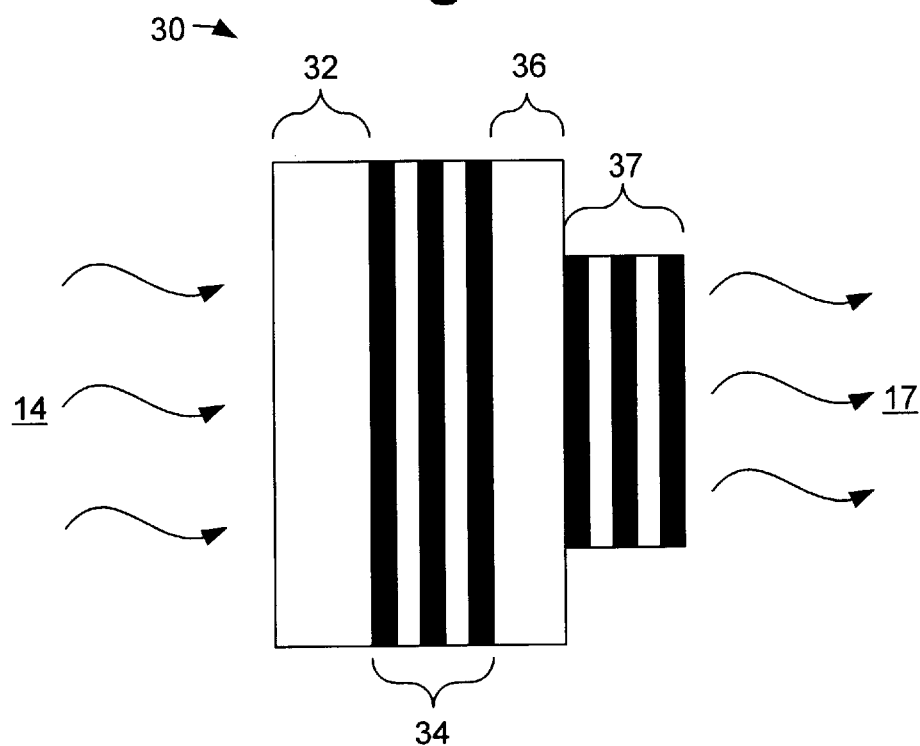
FIG. 3 is a simplified cross-sectional view illustrating the long wavelength laser of FIG. 1.

FIG. 3 is a simplified cross-sectional view illustrating the long wavelength laser 30 of FIG. 1. Long wavelength laser 30 includes two DBR's 34 and 37 between which is located active layer 36. The two DBR's of the long-wavelength laser 30 are comprised of multiple layers with alternating refractive index values, similar in construction to the DBR's 24 and 27 of the short-wavelength VCSEL 20. The laser cavity, formed by the two DBR's 34 and 37 and the active layer 36, of laser 30 is tuned to a longer wavelength, in the range of 1300 nm to 1600 nm. The material choices for the DBR's 34 and 37 include semiconductors, such as, aluminum-indium-gallium arsenide alloys (AlInGaAs), aluminum-gallium arsenide antimonide alloys (AlGaAsSb) or indium-gallium arsenide phosphide (InGaAsP) alloys, which are latticed matched to indium phosphide (InP). Because no electrical current passes through DBR's 34 and 37, they can be made of unintentionally doped semiconducting layers. Typically a gas having the desired dopant (such as zinc or silicon) is introduced with the other gases needed to grow the semiconductor. Unintentional doping means that no dopant species are introduced during the growth of the semiconductor. An unintentionally doped semiconductor will exhibit high resistance and lower free carrier absorption. This allows for very low loss mirrors since absorption due to free-carrier absorption (introduced by doping the semiconductors) has been eliminated. DBR 37 may also be realized using amorphous dielectric combinations, such as silicon dioxide, titanium dioxide, tantalum pentoxide and similar materials. If amorphous dielectrics are used, due to their larger refractive index ratio between the high-index and low-index materials, the mirrors will typically require fewer layers than the semiconductor alloy combinations to achieve comparable reflectivity.

Active layer 36 is grown over DBR 34. Active layer 36 comprises, for example, alternating layers of indium gallium-arsenide phosphide (InGaAsP) and indium phosphide (InP) or aluminum-indium-gallium arsenide (AlInGaAs) forming multiple quantum wells. The material choice and its composition may vary depending on the desired wavelength output of the device. Other choices of suitable active layers, which are lattice matched to gallium arsenide substrates (GaAs), such as indium-gallium-arsenide nitrides (InGaAsN) and gallium-arsenide-antimonide alloys (GaAsSb), may also be used. Active layers grown on GaAs may use the higher reflectivity mirrors obtainable using the aluminum-gallium arsenide (AlGaAs) alloys due to their higher index contrast.

DBR 37 is grown over active layer 36. DBR 37 is similar in structure to DBR 34. The light output 17 indicates the light output of long-wavelength laser 30. DBR 37 is less reflective than DBR 34 because light will be emitted through DBR 37 in the direction indicated by light output 17. Other means of creating the long wavelength cavity may also be implemented such as wafer bonding the active layer 36 to either semiconductor or dielectric mirrors; or etching holes in the substrate and depositing dielectric DBR mirrors on both sides of the active region to form the optical cavity.

Long-wavelength laser 30 is optically pumped by short wavelength light 14 that emanates from the short-wavelength laser 20, and emits long wavelength light output 17. The long-wavelength laser cavity is designed to absorb short-wavelength light 14 incident upon it, and emit long-wavelength light 17. This is done by designing the active layer 36 to efficiently absorb short-wavelength light and by designing the DBR 34 to transmit the short-wavelength light 14 into the long-wavelength cavity to be absorbed by the active layer 36. In order to absorb the short-wavelength light 14, the active layer 36 includes multi-quantum wells, barriers and separate confinement layers, which have bandgaps that are smaller than the wavelength of the short-wavelength light 14. The short-wavelength light 14 is then absorbed, thus converting the incoming photons into electron-hole pairs, which recombine in the quantum well to emit photons at the desired long wavelength emission. In order to provide for efficient absorption and funneling of the electron-hole pairs generated in the barriers and the cladding regions, a graded composition layer may be used to provide a built-in electric field to push the electrons and holes into the quantum wells. The two DBR's 34 and 37 of the long wavelength cavity are chosen to be transparent to the short-wavelength light to keep the carriers as close as possible to the active region for best efficiencies.

The output DBR 37 may, but need not, be designed to reflect the short-wavelength light back into the cavity to be further absorbed in the active layer 36, and also to prevent short wavelength emission through to the long-wavelength output 17. The two DBR's 34 and 37 should be highly reflective for long-wavelength light to provide low threshold and high efficiency for long-wavelength emission.

It is important to note that the orientation of the long-wavelength laser regarding which side is pumped and which side emits the long-wavelength light is arbitrary. Namely, the long-wavelength laser may be pumped from the substrate side, as shown in FIG. 3, or from the opposite side. Similarly the long-wavelength light output may be taken out from either side as well. It will be clear to persons skilled in the art that these variations are within the scope of the invention.

Figure 4:
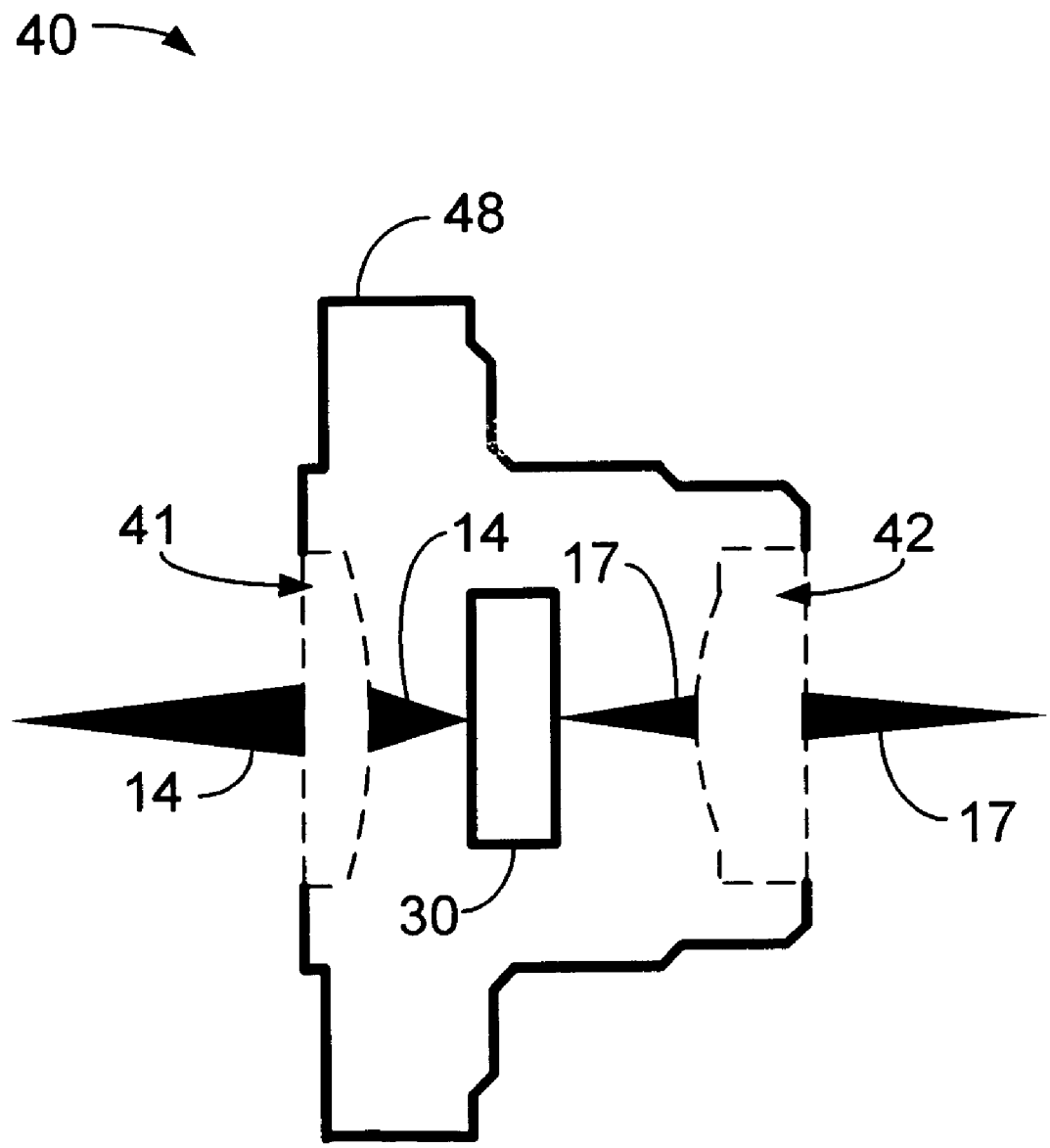
FIG. 4 is a cross-sectional schematic view illustrating the optical subassembly of FIG. 1.

FIG. 4 is a cross-sectional schematic view illustrating the optical subassembly 40 of FIG. 1. Optical subassembly 40 includes optical subassembly housing 48 in which long wavelength laser 30 is housed. Long wavelength laser 30 may, but need not, include a heat-sinking metallization pattern on its surface to aid in the dissipating of the heat generated through the absorption of short wavelength laser output 14. Preferably, the long wavelength laser 30 is fixed within housing 48 by a thermally conducting adhesive or may include metallized regions, which can be used to solder the long wavelength laser 30 to the housing 48. This allows the heat generated in the long wavelength laser 30 to be extracted through the housing 48.

As shown in FIG. 4, optical subassembly 40 optionally includes first optical element 41 and second optical element 42. First optical element 41 focuses the short wavelength laser output 14 from short wavelength laser 20 (FIG. 1) onto long wavelength laser 30 as illustrated. The short wavelength laser light 14 is focused onto long wavelength laser 30 with a spot size optimized for lowest threshold power and highest output efficiency of the long-wavelength laser 30. The presence of the optical elements 41 and 42 in the assembly is optional and may be used to improve the mutual coupling of light between the short wavelength laser 20, the long wavelength laser 30, and the optical fiber into which the long-wavelength light 17 will ultimately be focused.

The short wavelength laser light 14 is absorbed by long wavelength laser 30, which generates electron-hole pairs. These electron-hole pairs recombine to generate light at the longer wavelength, at which the cavity of the long wavelength laser 30 has maximum gain. This light is emitted from long wavelength laser 40 as long wavelength laser light 17 towards second optical element 42, if present. Second optical element 42 helps focus the long wavelength laser light 17 and aids in minimizing the spot size of the long wavelength light output 17. Long wavelength light output 17 may now be focused into, for example, an optical fiber connector 12 (FIG. 1) to which is connected an optical fiber for transmission over a fiber optics communications system.

The ability to place optical subassembly 40 within optical assembly housing 18 in optical communication with short wavelength laser 20 allows each laser device to be independently optimized, packaged and tested, and most importantly, used for independent purposes. If short wavelength output is desired then only the short wavelength assembly 20 is used. If a long wavelength output is desired, then the optical subassembly 40 is combined within the optical assembly 10 to provide a long wavelength light output.

The long-wavelength optical subassembly 30 may be manufactured as an independent optical element which may be inserted into the laser assembly 10 in such a way that it is positioned in the light output path of the short-wavelength laser 20. The long-wavelength output 17 of long wavelength laser 30 couples into the fiber, which is brought into proximity by the help of a connector guide as known to those skilled in the art. The short-wavelength laser output optically pumps the long-wavelength laser, which then emits light into the fiber.

It will be apparent to those skilled in the art that many modifications and variations may be made to the preferred embodiment of the present invention, as set forth above, without departing substantially from the principles of the present invention. For example, the present invention can be used to incorporate laser devices having various characteristics. All such modifications and variations are intended to be included herein within the scope of the present invention, as defined in the claims that follow.

What is claimed is:

1. An optical assembly, comprising:
   a housing;
   a prefabricated electrically pumped short wavelength laser located in the housing and configured to provide a short wavelength laser output;
   a prefabricated optically pumped long wavelength laser configured to provide a long wavelength laser output, the long wavelength laser optically pumped by the short wavelength laser output; and
   a removable optical subassembly including the prefabricated long wavelength laser and located within the housing in a position at which the output of the short wavelength laser is applied to the long wavelength laser.

2. The optical assembly of claim 1, wherein the short wavelength laser optically pumps the long wavelength laser to produce a long wavelength laser output.

3. The optical assembly of claim 1, wherein the long wavelength laser excludes the short wavelength laser output from the long wavelength laser output.

4. The optical assembly of claim 1, further comprising a first optical element located within the optical subassembly, the first optical element located in a light output path of the short wavelength laser and configured to focus the short wavelength laser output on the long wavelength laser.

5. The optical assembly of claim 1, further comprising a second optical element located within the optical subassembly, the second optical element located in a light output path of the long wavelength laser and configured to focus the long wavelength laser output.

6. The optical assembly of claim 1, wherein the housing locates the optical subassembly and the prefabricated short wavelength laser in a predetermined position.

7. A method for forming an optical assembly, comprising the steps of:
   locating a prefabricated electrically pumped short wavelength laser in a housing;
   locating a long wavelength optically pumped laser in a removable optical subassembly; and
   placing the removable optical subassembly containing the long wavelength laser in the housing and in a light output path of the short wavelength laser, such that an output of the short wavelength laser is directed into the optical subassembly and optically pumps the long wavelength laser resulting in a long wavelength laser output.

8. The method of claim 7, further comprising excluding the short wavelength laser output from the long wavelength laser output.

9. The method of claim 7, further comprising the step of including a first optical element in the optical subassembly, the first optical element located in the light output path of the short wavelength laser and configured to focus the short wavelength laser output on the long wavelength laser.

10. The method of claim 9, further comprising the step of focusing the output of the short wavelength laser through the optical element in order to form an input to the long wavelength laser.

11. The method of claim 7, further comprising the step of including a second optical element in the optical subassembly, the second optical element located in a path of the long wavelength laser output and configured to focus the long wavelength laser output.

12. The method of claim 11, further comprising the step of focusing the output of the long wavelength laser output through the second optical element.

13. A long wavelength laser, comprising:
   a housing;
   a prefabricated electrically pumped short wavelength laser located in the housing and having a short wavelength laser output; and
   a removable optical subassembly containing a prefabricated optically pumped long wavelength laser, the removable optical subassembly located in the housing and in a path of the short wavelength laser output so that the short wavelength laser output optically pumps the long wavelength laser.

14. The laser of claim 13, wherein the optical subassembly further comprises a first optical element located in a path of the short wavelength laser output, the first optical element configured to focus the short wavelength laser out on the long wavelength laser.

15. The laser of claim 13, wherein the optical subassembly further comprises a second optical element located in an output path of the long wavelength laser, the second optical element configured to focus the long wavelength laser output.

16. The laser of claim 13, wherein the long wavelength laser excludes the short wavelength laser output from an output of the long wavelength laser.

17. The laser of claim 13, wherein the housing locates the optical subassembly and the prefabricated short wavelength laser in a predetermined position.

* * * * *